United States Patent [19]

Edmond et al.

[11] Patent Number: 5,416,342
[45] Date of Patent: May 16, 1995

[54] BLUE LIGHT-EMITTING DIODE WITH HIGH EXTERNAL QUANTUM EFFICIENCY

[75] Inventors: John A. Edmond, Apex; Hua-Shuang Kong, Raleigh, both of N.C.

[73] Assignee: Cree Research, Inc., Durham, N.C.

[21] Appl. No.: 81,668

[22] Filed: Jun. 23, 1993

[51] Int. Cl.$^6$ .............................................. H01L 33/00
[52] U.S. Cl. ........................................ 257/76; 257/77; 257/98; 257/99; 257/101; 257/103
[58] Field of Search ....................... 257/76, 77, 91, 95, 257/98, 99, 101, 103, 102, 623

[56] References Cited

U.S. PATENT DOCUMENTS

| | | | |
|---|---|---|---|
| 4,918,497 | 4/1990 | Edmond | 357/17 |
| 5,027,168 | 6/1991 | Edmond | 357/17 |
| 5,063,421 | 11/1991 | Suzuki et al. | 257/77 |
| 5,187,547 | 2/1993 | Niina et al. | 257/77 |
| 5,243,204 | 9/1993 | Suzuki et al. | 257/77 |

FOREIGN PATENT DOCUMENTS

| | | | |
|---|---|---|---|
| 58-64074 | 4/1983 | Japan | 257/77 |
| 0221673 | 1/1990 | Japan | 257/77 |
| 0471278 | 3/1992 | Japan | 257/77 |
| 4112583 | 4/1992 | Japan | 257/77 |

OTHER PUBLICATIONS

K. H. Huang, et al., Twofold Efficiency Improvement in High Performance AlGaInP Light-Emitting Diodes in the 555–620 nm Spectral Region Using a Thick GaP Window Layer, *Appl. Phys. Lett.*, vol. 61, No. 9, Aug. 1992, pp. 1045–1047.

Primary Examiner—William Mintel
Attorney, Agent, or Firm—Bell, Seltzer, Park & Gibson

[57] ABSTRACT

A light emitting diode is disclosed that emits light in the blue portion of the visible spectrum with high external quantum efficiency. The diode comprises a single crystal silicon carbide substrate having a first conductivity type, a first epitaxial layer of silicon carbide on the substrate and having the same conductivity type as the substrate, and a second epitaxial layer of silicon carbide on the first epitaxial layer and having the opposite conductivity type from the first layer. The first and second epitaxial layers forming a p-n junction, and the diode includes ohmic contacts for applying a potential difference across the p-n junction. The second epitaxial layer has side walls and a top surface that forms the top surface of the diode, and the second epitaxial layer has a thickness sufficient to increase the solid angle at which light emitted by the junction will radiate externally from the side walls, but less than the thickness at which internal absorption in said second layer would substantially reduce the light emitted from said top surface of the diode.

53 Claims, 5 Drawing Sheets

BLUE LIGHT-EMITTING DIODE WITH HIGH EXTERNAL QUANTUM EFFICIENCY

FIELD OF THE INVENTION

The present invention relates to light-emitting diodes, and in particular relates to blue light-emitting diodes formed in silicon carbide. This invention was made with the support of The Defense Advanced Research Projects Agency under Contract or Grant No. N00014-92-C-0100. The government may have certain rights in this invention.

BACKGROUND OF THE INVENTION

Light-emitting diodes, commonly referred to as "LED's" are semiconductor devices which convert electrical energy into emitted light.

As is known to those familiar with atomic and molecular structure of semiconductor materials and electronic devices, electromagnetic radiation, including visible light, is produced by electronic transitions that occur in atoms, molecules, and crystals. Furthermore, the color of light that can be produced from an LED is a function of the basic semiconductor material from which the LED is formed, and the manner in which the semiconductor material may be doped. As is further known to such persons, blue light represents one of the higher energy phenomena within the spectrum visible to the human eye. By way of comparison, higher energy transitions such as ultraviolet light are invisible to the human eye. Similarly, red light represents the lower energy end of the visible spectrum, and infrared, far infrared, and microwave radiation represent even lower energy transitions that are out of the range of the visible spectrum.

Only certain semiconductor materials have the capability to permit the type of electronic transitions that will produce blue light in the visible spectrum. One of these materials is silicon carbide (SIC) which can produce several different wavelengths of blue light. The characteristics of silicon carbide and the manner in which blue light can be produced using silicon carbide are thoroughly discussed in U.S. Pat. Nos. 4,918,497 and 5,027,168, both entitled "Blue Light-Emitting Diode Formed in Silicon Carbide." Both of these patents are assigned to the assignee of the present application. These patents are incorporated entirely herein by reference ("the '497 and '168 patents").

The increased availability of blue LEDs has, however, increased both the demand for the devices and for particular performance specifications. In particular, one important performance characteristic of an LED is the amount of light it can produce from a given amount of electricity, a relationship referred to as quantum efficiency. As the use of blue LEDs has increased, the demand for LEDs with higher quantum efficiencies has likewise increased.

There are, however, some particular aspects of silicon carbide which must be addressed when attempting to increase the quantum efficiency.

LEDs formed in more conventional materials such as gallium phosphide (GAP) provide a comparative example. Gallium phosphide's conductivity is generally sufficient for the entire device to light up as current passes across the p-n junction. Stated differently, current spreads relatively easily in gallium phosphide, thus spreading the generated light relatively easily as well. For lower conductivity materials such as p-type silicon carbide, however, the current does not spread as efficiently throughout the entire device, thus reducing the amount of emitted light that could otherwise be generated.

The conductivity of silicon carbide can be increased, of course, by increasing its dopant concentration. Increasing the doping level is a less desirable solution, however, because the increased doping lowers the transparency of the device, thus detracting from its overall performance.

Furthermore, producing a blue LED in silicon carbide requires various dopant and current injection considerations in a manner described thoroughly in the '497 and '168 patents.

OBJECT AND SUMMARY OF THE INVENTION

Accordingly, it is an object of the present invention to provide a light-emitting diode that emits light in the blue portion of the visible spectrum with a relatively high external quantum efficiency.

In one embodiment, the invention comprises an LED in which the top epitaxial layer has a thickness sufficient to increase the solid angle at which light emitted by the junction will radiate externally from the side walls of the layer, but less than the thickness at which internal absorption in the layer would substantially reduce the light emitted from the top surface of the diode.

In another embodiment, the invention comprises increasing the surface area of the top surface of the light-emitting diode.

In another embodiment, the invention comprises using a metal ohmic contact that will form a reflective surface from which light generated by the diode will reflect rather than be absorbed.

In yet another embodiment, the invention comprises a method of forming a reflective ohmic contact on silicon carbide.

In yet another embodiment, the invention comprises the use of a transparent conductive contact on a blue light-emitting diode formed in silicon carbide.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

Figure 1:
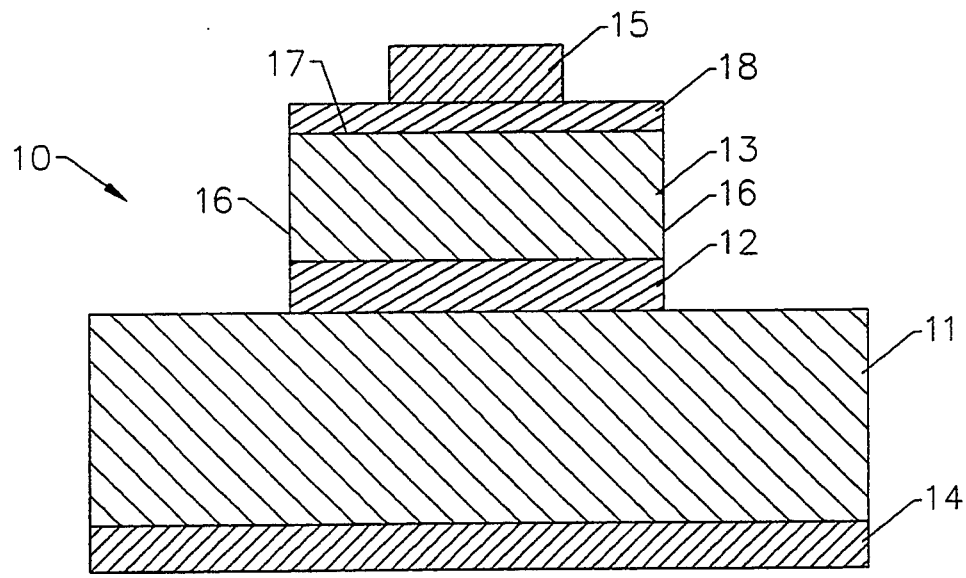
FIG. 1 is a cross-sectional schematic view of a first embodiment of a blue LED according to the present invention.

The present invention is a light-emitting diode that emits light in the blue portion of the visible spectrum (i.e., approximately 400–480 nanometers (nm)) with high external quantum efficiency. In a first embodiment illustrated in FIG. 1, the blue LED is broadly designated at 110. The diode 10 includes a single crystal silicon carbide substrate 11 having a first conductivity type. A first epitaxial layer of silicon carbide 12 is on the substrate 11 and has the same conductivity type as the substrate. A second epitaxial layer 13 is on the first epitaxial layer and has the opposite conductivity type from the first layer. As a result, the first and second epitaxial layers 12 and 13 form a p-n junction therebetween. Ohmic contacts 14 and 15 respectively complete the structure for providing the current injected across the junction to produce light from the diode.

FIG. 1 schematically shows that in the first embodiment of the invention, the second epitaxial layer 13 has sidewalls designated at 16, and a top surface designated at 17. The second epitaxial layer 13 has a thickness sufficient to increase the solid angle at which light emitted by the junction will radiate externally from the sidewall 16, but less than the thickness at which internal absorption in the layer 13 would substantially reduce the light emitted from the top surface 17 of the diode.

As is known to those familiar with the basic principles of optics, the extent to which light will be reflected or refracted at the surface of a material is a function of the refractive index of the material to the particular wavelength of light and the refractive index of the adjacent material to light of that wavelength. These properties define a critical angle using the well-known relationship of Snell's Law. Summarized briefly, Snell's Law defines a critical angle for any two adjacent materials, based upon their respective indexes of refraction. The critical angle is defined as the angle between the direction of propagation of the light, and a line normal to the boundary at the point the light strikes the boundary. When light strikes the boundary between the materials at an angle less than the critical angle, it changes direction somewhat (i.e., it refracts), but is nevertheless emitted. If the light strikes the boundary at an angle greater than the critical angle, however, the light is totally internally reflected rather than emitted.

Because light from an LED is generated at the junction, the amount of light that will be emitted from the top surface 17 of the diode is limited by total internal reflection, which, as stated above, is determined by the critical angle defined by Snell's Law and the refractive indexes of the semiconductor and the surrounding medium. As is known to those familiar with light-emitting diodes, the surrounding medium will usually be either a plastic material, or the ambient surroundings; i.e., air. Light rays that are incident on the top surface 17 at an angle less than the critical angle are transmitted. The remaining light rays are reflected back into the device where most are absorbed.

Alternatively, the amount of light emitted from the sides of the diode is determined by both the total internal reflection and by the thickness of the second layer 13. Light rays that strike the sidewalls 16 at angles less than the critical angle will be transmitted. Nevertheless, if the layer 13 is relatively thin (e.g., 1 or 2 microns as set forth in the '497 and '168 patents), some light rays heading towards the sidewalls will instead be totally internally reflected off the top surface of the diode and will be absorbed in the substrate before they reach one of the sidewalls 16. As an approximation, where a ray of light is considered to have begun at a point source and headed toward a given sidewall, the proportion of transmitted light can be roughly estimated by the solid angle of intersection between the sidewall 16 of the second layer 13 and the cone of radiation for sideways-directed light. The total light from the sidewalls of the diode would then be the sum of the solid angles for all of the points on the entire light-emitting area of the junction for each of the sidewalls 16. A thorough discussion of these principles is set forth in Huang, et al., "Two-Fold Efficiency Improvement in High Performance AlGaInP Light-Emitting Diodes in the 555–620 nm Spectral Region Using a Thick GaP Window Layer," *Appl. Phys. Lett.* 61(9), Aug. 31, 1992, pp. 1045–1047.

As further known to those familiar with the interaction between light and materials, any given material through which light passes will absorb some of the light. The amount absorbed is based on the wavelength of the light, the absorption coefficient of the material (usually expressed in units of reciprocal length; e.g. $cm^{-1}$), and the distance the light travels through the material. Accordingly, although a thicker top epitaxial layer offers more external emission as described herein, the optimum thickness is limited by the corresponding absorption of the layer.

Figure 7:
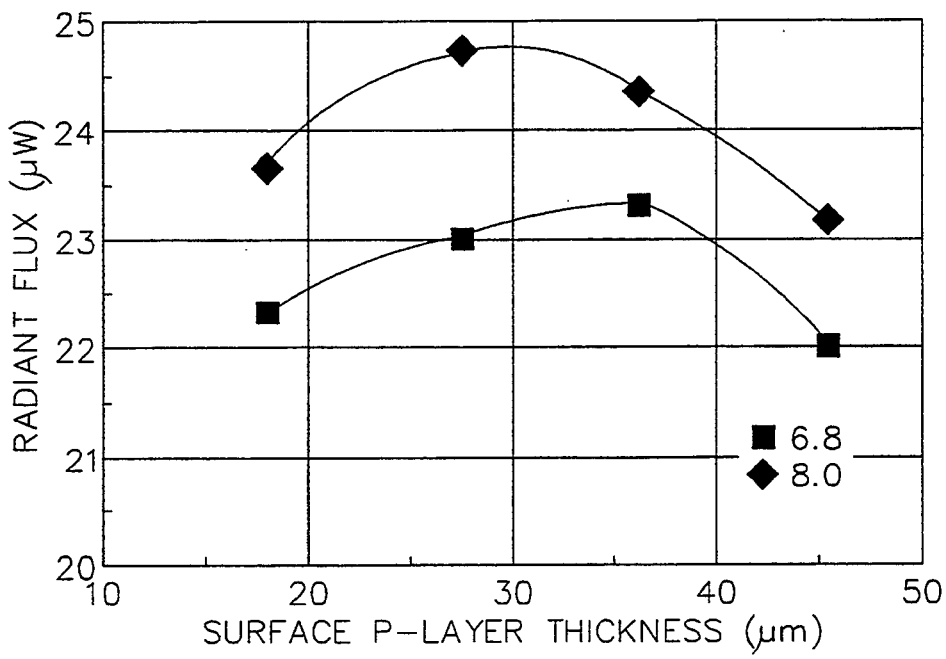
FIG. 7 is a second plot of light output as a percentage taken against the thickness of the top epitaxial layer of blue LEDs according to the present invention and measured in microns.
Figure 8:
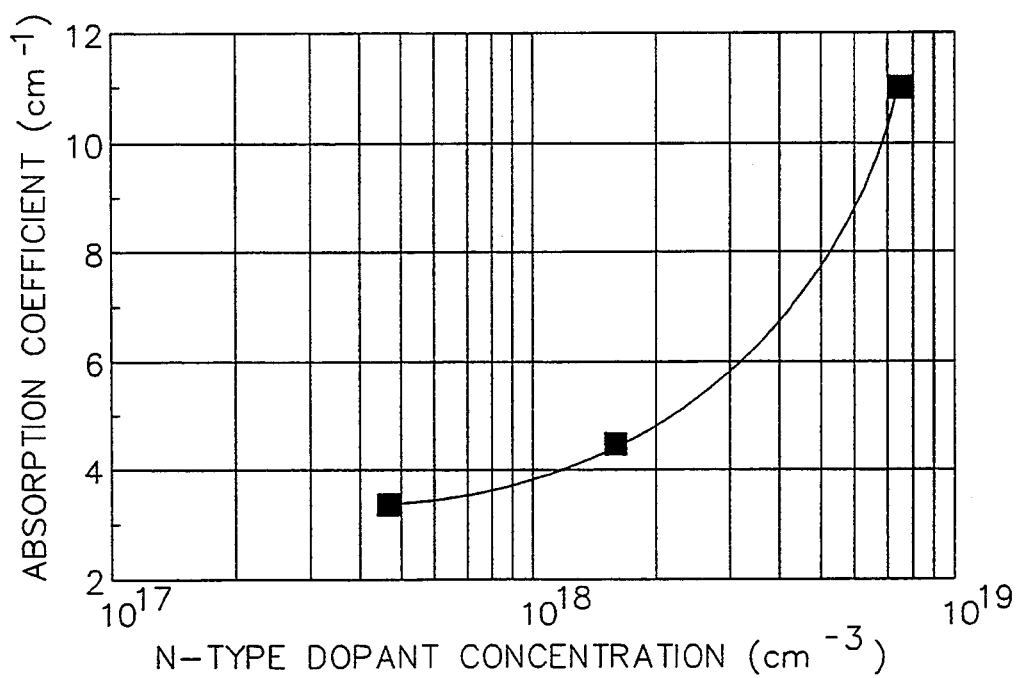
FIG. 8 is a plot of the absorption coefficient of silicon carbide as a function of n-type dopant concentration.
Figure 9:
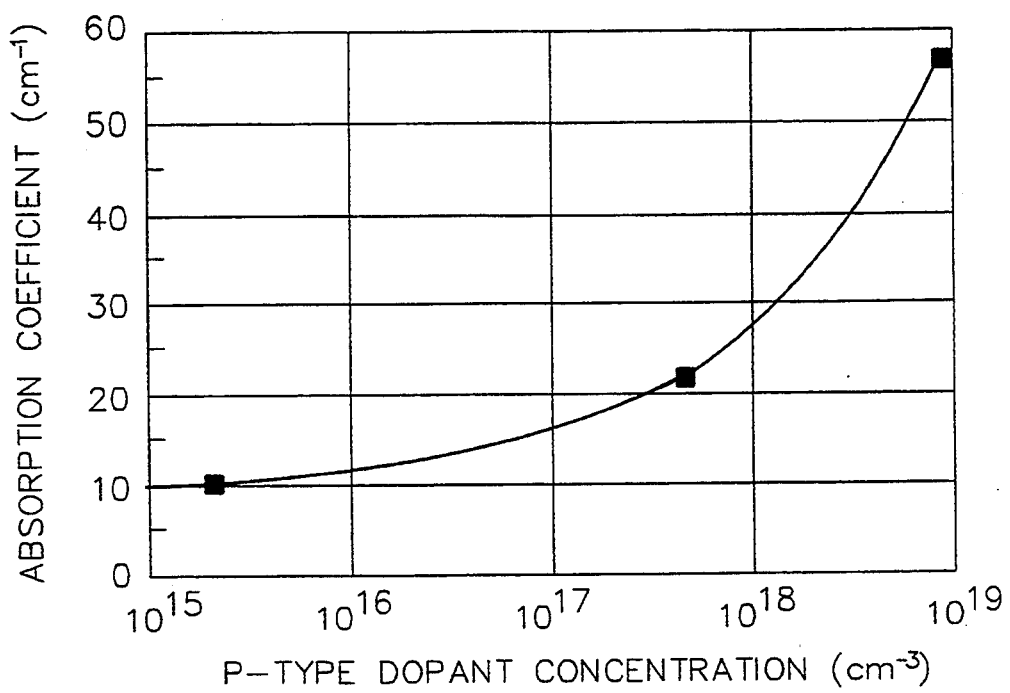
FIG. 9 is a plot of the absorption coefficient of silicon carbide as a function of p-type dopant concentration.

FIGS. 7–9 illustrate this effect. FIG. 7 illustrates that the radiant flux of two diodes according to the present invention increases with an increase in the thickness of the top epitaxial layer up to a maximum, and then begins to decrease as the layer becomes too thick and the effects of absorption begin to overtake the benefits of the thicker layer. As indicated in FIG. 7, one diode had a 6.8 mil by 6.8 mil mesa, and the other had an 8.0 mil by 8.0 mil mesa. FIGS. 8 and 9 illustrate how the absorption coefficients for n-type and p-type silicon carbide increase as the dopant concentration (in $cm^{-3}$) increases.

Figure 6:
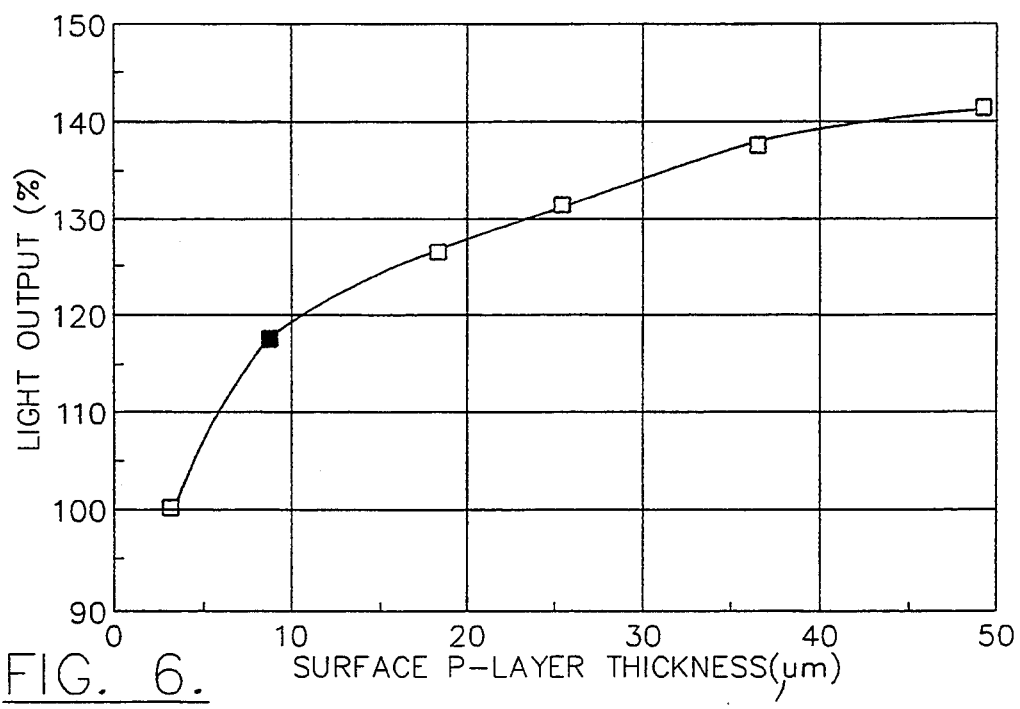
FIG. 6 is a plot of light output as a percentage taken against the thickness of the top epitaxial layer of blue LEDs according to the present invention and measured in microns.

In preferred embodiments of the present invention, the thickness of the second layer 13 is on the order of about 25 microns, a large increase over prior commercial devices for which such thicknesses are typically on the order of 1–3 microns. FIG. 6 shows how the increase in the surface layer 13 thickness increases the light output of a device according to the invention. In FIG. 6, the output of a device with a 3 micron surface layer is taken as a baseline value of 100%. The increased light output resulting from increased surface player thickness is then plotted as a function of thickness. As demonstrated by FIG. 6, the increase in the thickness of the second layer 13 has a very effective positive impact on the light output of the device. To date, a thickness of about 25 microns has been found to be appropriate.

FIG. 1 illustrates a further aspect of the present invention, reflective contacts. FIG. 1 illustrates the ohmic contact to the substrate as a deposited metal 14. As is known to those familiar with such materials, in order to get appropriate ohmic behavior, the metal of the ohmic contact 14 must normally be alloyed or annealed after being deposited on the appropriate substrate, epitaxial layer, or other portion of the device 10. Such alloying or annealing, however, tends to reduce the reflectivity that a deposited metal will normally exhibit. For example, aluminum, when deposited on silicon carbide, but not annealed or alloyed, will exhibit a reflectivity of 90% or more. As deposited, however, aluminum generally will not exhibit ohmic behavior with respect to silicon carbide. Thus, in devices to date, reflectivity must be sacrificed in exchange for ohmic behavior. In turn, light generated by the diode that strikes the unreflective contact will tend to be absorbed rather than reflected or emitted.

The invention, however, further increases the external efficiency of the LED by incorporating a reflective metal deposit as an ohmic contact which remains unalloyed and unannealed and therefore maintains its reflectivity.

As illustrated in FIG. 1, the reflective metal, such as aluminum, is deposited upon a very thin layer 18 that forms a top portion of the LED 10. The layer 18 is highly doped and is between the reflective metal deposit 15 and the diode, in particular the second layer 13. The highly doped layer has the same conductivity type as the portion of the diode to which it is adjacent, in this case the same conductivity type as the second layer 13. The highly doped layer 18 has a dopant concentration sufficient to lower the barrier between the metal contact 15 and the second layer 13 enough to provide ohmic behavior between the unannealed reflective metal and the diode. As a result, at least one of the ohmic contacts, and potentially both of them, can comprise an unannealed metal contact, such as the contact 15, which forms a reflective surface from which light generated by the diode will reflect rather than be absorbed. Although it will be recognized that the reflected light generated at the junction will be reflected back into the epitaxial layers 12 and 13, the fact that they are reflected at all, rather than simply absorbed, increases the amount of such light that will eventually escape from either the top surface 17 or the sidewalls 16 of the LED 10. To date, the use of reflective contacts in this manner has resulted in increases as great as 50% in the overall efficiency of the devices as compared to prior LEDs.

A thorough discussion of a method of producing an ohmic contact in this manner is set forth in U.S. application Ser. No. 07/943,043; filed Sep. 10, 1992 by Glass et al for "Method of Forming Ohmic Contacts to p-Type Wide Bandgap Semiconductors and Resulting Ohmic Contact Structure," the contents of which are incorporated entirely herein by reference. In preferred embodiments of the invention the dopant concentration of the highly doped layer is greater than about 2E19 ($2 \times 10^{19}$ cm$^{-3}$), and most preferably is greater than about 5E19 ($5 \times 10^{19}$ cm$^{-3}$).

In the present invention, preferred metals for the ohmic contacts, including the reflective contacts, are aluminum, gold, platinum, and silver. Similarly, the preferred polytypes for the silicon carbide are the 6H, 4H, and 15R polytypes.

Figure 2:
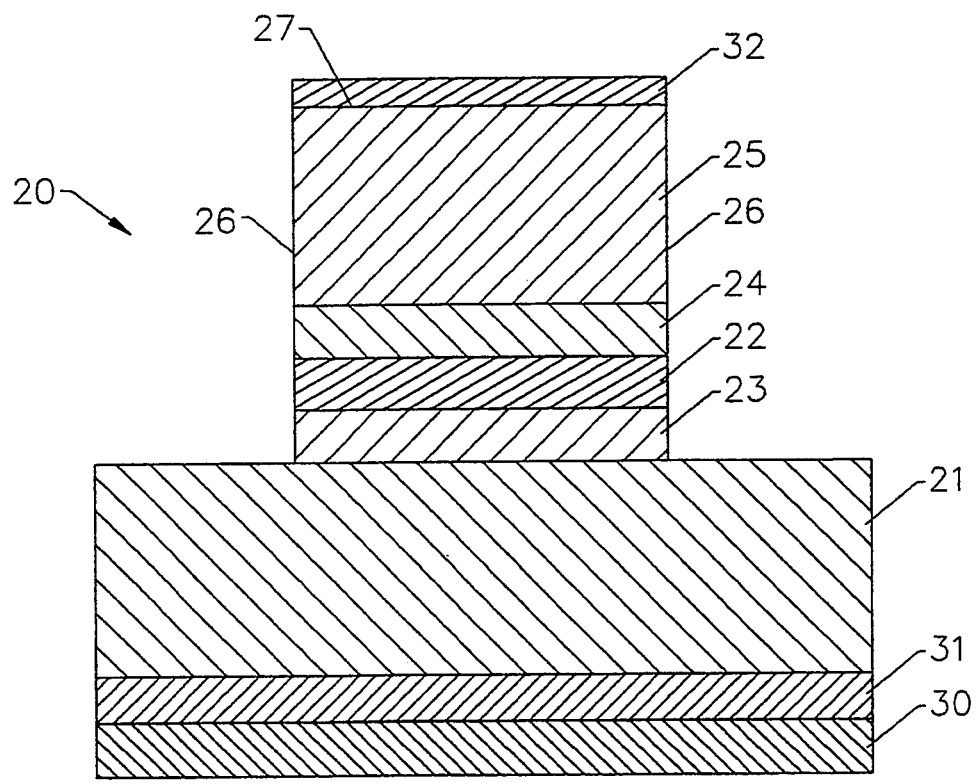
FIG. 2 is another cross-sectional schematic illustration of a second embodiment of a blue LED according to the present invention.

Some further features of the invention are shown in the embodiment illustrated in FIG. 2 in which the LED is broadly designated at 20. FIG. 2 illustrates a silicon carbide single crystal substrate 21 having a first conductivity type. A first epitaxial layer is formed of a compensated layer and a predominantly uncompensated layer As used herein, the term "compensated" refers to a portion of semiconductor material doped with both donor and acceptor dopants. Thus, a compensated p-type layer would include both p-type and n-type dopants, but with a sufficient excess of the p-type dopants to give the layer p-type characteristics overall. The reasons for using compensated layers in silicon carbide LEDs are set forth in an appropriate manner in the '497 and '168 patents already incorporated herein by reference.

As illustrated in FIG. 2, the substantially uncompensated layer 23 is adjacent to substrate 21 while the compensated layer 22 is adjacent a second epitaxial layer which has a conductivity type opposite from the conductivity type of layers 22, 23, and 21. The epitaxial layers 24 and form a p-n junction from which light is emitted when a potential difference is applied across the diode 20. The third epitaxial layer 25 is on the second epitaxial layer 24 and has the same conductivity type as the second epitaxial layer 24. As in the first embodiment, the third layer has sidewalls 26 and a top surface 27 that forms the top surface of the diode 20. The third epitaxial layer 25 has a thickness sufficient to increase the solid angle at which light emitted by the junction will radiate externally from the sidewalls but less than the thickness at which internal absorption in the layer 25 would substantially reduce the light emitted from the top surface 27 of the diode.

As stated above, the first epitaxial layer is formed by respective compensated and uncompensated layers 22 and with the predominantly uncompensated layer 23 being adjacent to substrate 21. The second epitaxial layer 24 is likewise compensated so that injection of carriers across the junction between layers 24 and 22 takes place between compensated portions of silicon carbide to give the appropriate energy transitions and wavelengths as described in the '497 and '168 patents.

Figure 3:
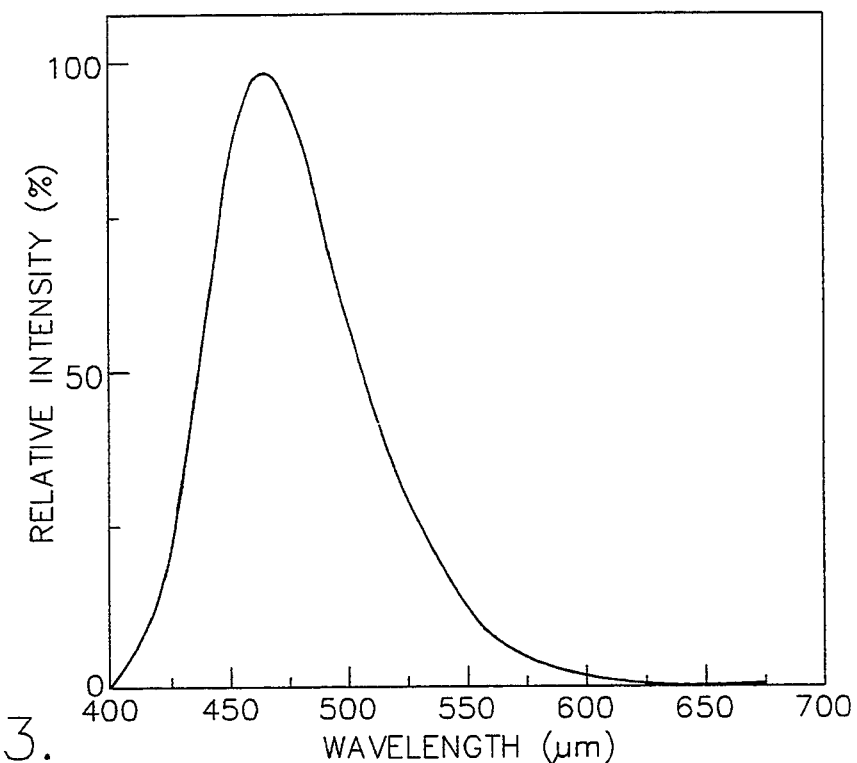
FIG. 3 is a plot of relative intensity plotted against wavelength for a blue LED according to the present invention.
Figure 4:
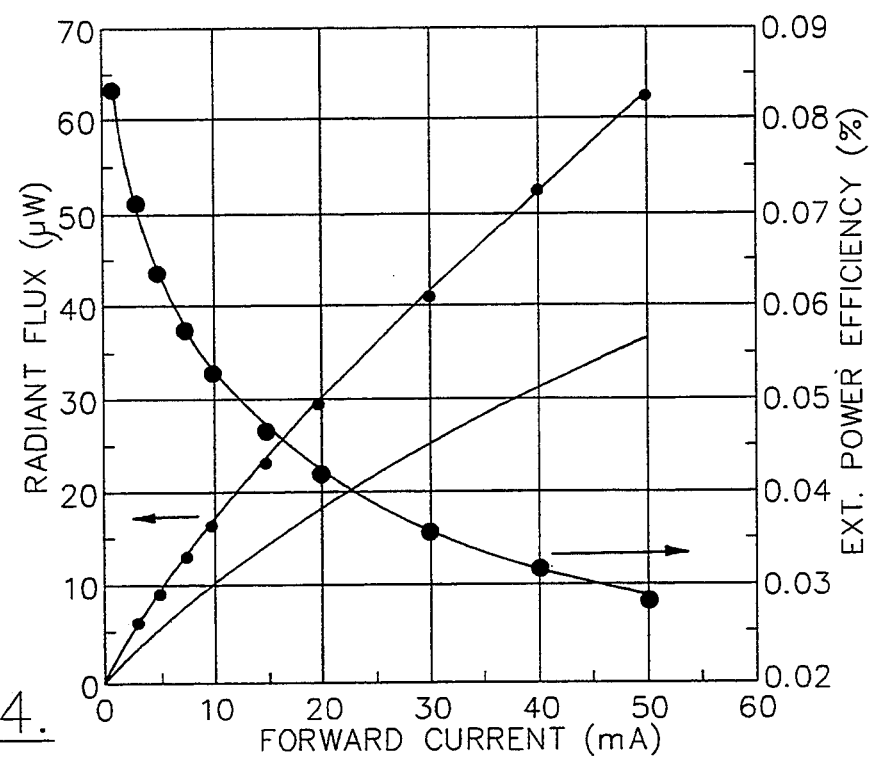
FIG. 4 is a combination plot of radiant flux in microwatts and external power efficiency in percentage plotted against forward current in milliamps across the diode.

In a preferred embodiment, and to obtain a peak wavelength in the 460–475 nm range (and preferably 465–470 nm), the substrate 21 and layers 22 and 23 are of n-type conductivity, while the second epitaxial layer 24 and the third epitaxial layer 25 are p-type conductivity. In a most preferred embodiment, the third layer 25 and the uncompensated layer 23 are doped slightly more heavily than their respective adjacent layers 24 and 22 in a manner which encourages the proper transition of carriers across the junction. FIGS. 3 and 4 illustrate these characteristics, with FIG. 3 showing the peak wavelengths and FIG. 4 showing radiant flux and external power efficiency, both as a function of forward current in milliamps. The undotted lower curve in FIG. 4 represents the performance of prior diodes not specifically incorporating the features of the present invention.

In other embodiments, and for which a slightly different wavelength of blue light is desired, layers 22 and 23, and the substrate 21 can be of p-type conductivity while layers 24 and 25 can be of n-type conductivity. Preferably, the third layer 25 is predominantly uncompensated as is the substrate.

FIG. 2 further illustrates that in preferred embodiments, the epitaxial layers 22 through 25 form a mesa structure upon the substrate 21.

In the embodiment illustrated in FIG. 2, the reflective metal contact is designated at 30, and is made to the semiconductor 21. The heavily doped layer that permits the ohmic contact is likewise illustrated as 31. It will be understood that the use of reflective contacts and the appropriate highly doped layer can be made to one or both of the ohmic contacts to the device 20.

In another embodiment, where the LED is to be placed in a plastic carrier material, as is quite common for such devices, the thickness of the third layer 25 is less than the thickness at which internal absorption in the layer would substantially reduce the light emitted from the top surface of the diode.

FIG. 2 illustrates another embodiment of the invention in which one or more of the contacts are formed of a substantially transparent conductive material. In FIG. 2, the transparent contact is illustrated at 32 and is preferably formed of an indium-tin-oxide (ITO) material which is useful for transparent contacts in electro-optical applications in a manner well known to those familiar with this art. Any other compounds having similar transparent characteristics would likewise be acceptable, provided that they can carry enough current to drive the LED without being applied in such thicknesses that their transparency would be reduced beyond the point at which the transparent contact would be advantageous. As in the case of the reflective contact of the present invention, it will be understood that the transparent contact can be used for one or both of the contacts to an LED, and can be used in combination with either the reflective contact or a more typical annealed or alloyed ohmic contact. Typically, an ITO contact is used in conjunction with a contact pad (not shown) of a more conventional metal or other conductor.

Figure 5:
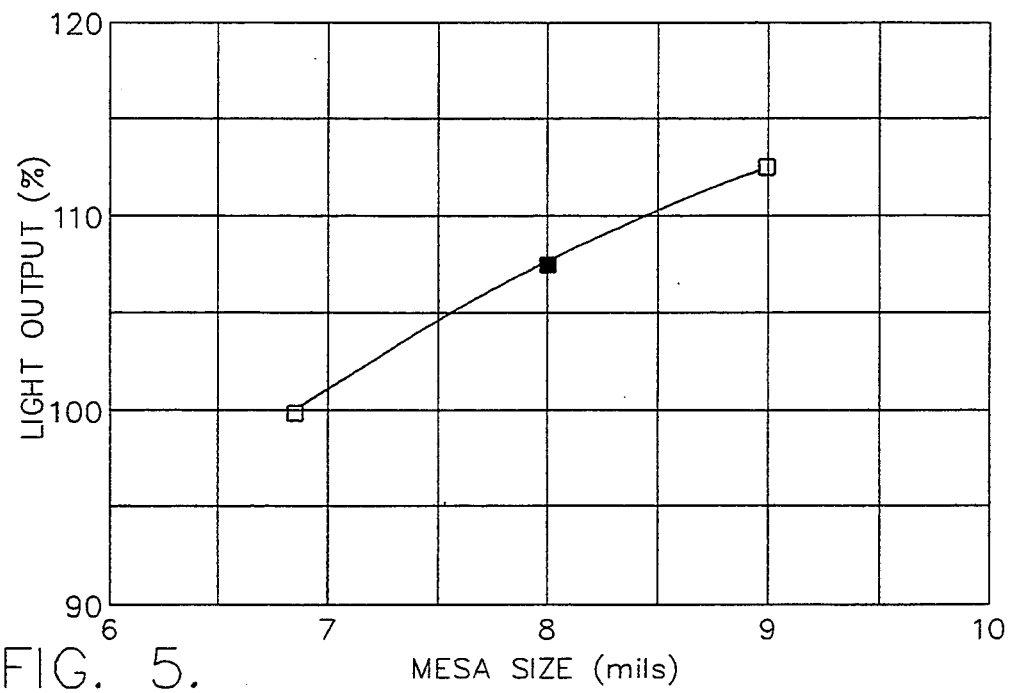
FIG. 5 is a plot of light output expressed as a percentage taken against the area of the top surface of the diode measured in mils along each side of a square mesa.

In yet another embodiment, the invention comprises an LED in which the cross-sectional area of the top surface, as indicated at 17 in FIG. 1 and at 27 in FIG. 2, is similarly increased. In preferred embodiments, the cross-sectional area is increased from approximately 170 by 170 square microns of a typical LED to approximately 200 by 200 square microns. Increasing this parameter has given increases of at least 7% in present devices. FIG. 5 illustrates the increase in light output of a blue LED formed in silicon carbide when the mesa area is increased.

In this regard, the use of a wider mesa in conjunction with a thicker "window layer" has synergistic advantages. As stated above, silicon carbide, particularly p-type, tends to be somewhat resistive. Thus, an applied current spreads in a less than ideal manner throughout the epitaxial layers. Making the mesa wider as well as thicker increases the opportunity for current to spread when a potential difference is applied across the diode. The greater area of the diode gives the current more initial room to spread, and the deeper window layer adds for even further lateral spreading as the current moves axially through the diode. The result is a greater flow of current through the diode and across the junction to produce a greater amount of visible light. Thus, in addition to providing advantages on an individual basis, the wider mesa and deeper window layer provide a synergistic effect that increases the external quantum efficiency of the resulting diode even more.

In yet another embodiment, the invention provides a method of forming a reflective ohmic contact on a silicon carbide light-emitting diode to thereby increase the light emitted externally from the diode. The method comprises applying a metal to a surface portion of the silicon carbide diode and in which the portion of the diode having the surface is a highly doped layer of silicon carbide, and wherein the highly doped layer has a dopant concentration sufficient to lower the barrier between the metal contact and the diode portion enough to provide ohmic behavior between the metal and the diode portion. In preferred embodiments, the method can further comprise the step of heating the applied metal sufficiently to improve the ohmic characteristics of the metal contact, but less than the amount of heating that would substantially reduce the reflectivity of the applied metal.

In preferred embodiments, the step of applying the metal can comprise sputtering or evaporation techniques.

In use, the various aspects of the invention have given significant increases. For example, increasing the standard thickness of the top epitaxial layer from 3 microns to approximately 25 microns increases the external output of the LED by at least about 30% Increasing the surface area from 170 by 170 square microns to 200 by 200 square microns increases the external output approximately 7%. Adding a reflective contact rather than an annealed or opaque contact gives a 50% increase in external output. When combined, all of these improvements have increased the efficiency of blue LEDs, according to the present invention, nearly 100% over earlier devices such as those described in the '497 and '168 patents.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A light emitting diode that emits light in the blue portion of the visible spectrum with high external quantum efficiency, said diode comprising:

a single crystal silicon carbide substrate having a first conductivity type;

a first epitaxial layer of silicon carbide on said substrate and having the same conductivity type as said substrate;

a second epitaxial layer of silicon carbide on said first epitaxial layer and having the opposite conductivity type from said first layer, said first and second epitaxial layers forming a p-n junction; and ohmic contacts for applying a potential difference across said p-n junction; and wherein said second epitaxial layer has side walls and a top surface that define the top surface and top side walls of said diode, and said second epitaxial layer is sufficiently thick to increase the solid angle at which light emitted by the junction will radiate externally from said side walls, but less than the thickness at which internal absorption in said second layer would substantially reduce the light emitted from said top surface of the diode.

2. A light emitting diode according to claim 1 wherein said second epitaxial layer has a thickness of about 25 microns.

3. A light emitting diode according to claim 1 wherein said top surface has an area of about 200 by 200 square microns.

4. A light emitting diode according to claim 1 wherein at least one of said ohmic contacts comprises an unannealed metal contact, said metal contact forming a reflective surface from which light generated by said diode will reflect rather than be absorbed.

5. A light emitting diode according to claim 4 and further comprising a highly doped layer between said unannealed metal contact and said diode, said highly doped layer having the same conductivity type as the portion of the diode to which it is adjacent, and said highly doped layer having a dopant concentration sufficient to lower the barrier between said metal contact and said diode portion sufficiently to provide ohmic behavior between said unannealed metal and said diode portion, said highly doped layer being thin enough to prevent the dopant concentration from substantially reducing the light emitted from said top surface of said diode.

6. A light emitting diode according to claim 4 wherein said metal contact is selected from the group consisting of aluminum, gold, platinum, and silver.

7. A light emitting diode according to claim 1 wherein the silicon carbide has a polytype selected from the group consisting of the 6H, 4H, and 15R polytypes.

8. A light emitting diode according to claim 1 wherein at least one of said ohmic contacts comprises a layer of indium-tin-oxide (ITO) on said second epitaxial layer, said ITO layer having a thickness sufficient to carry current to said second layer sufficient for said diode to emit light, but thin enough to remain substantially transparent.

9. A light emitting diode according to claim 1 wherein one of said ohmic contacts is to said substrate and the other is to said second epitaxial layer.

10. A light emitting diode that emits light in the blue portion of the visible spectrum with high external quantum efficiency, said diode comprising:
   a single crystal silicon carbide substrate having a first conductivity type;
   a first epitaxial layer of silicon carbide on said substrate and having the same conductivity type as said substrate;
   a second epitaxial layer of silicon carbide on said first epitaxial layer and having a compensated conductivity type opposite from the conductivity type of said first layer,
   said first and second epitaxial layers forming a p-n junction;
   ohmic contacts for applying a potential difference across said p-n junction; and
   a third epitaxial layer upon said second epitaxial layer and having the same conductivity type as said second epitaxial layer, said third layer having side walls and a top surface that forms the top surface of said diode, and said third epitaxial layer having a thickness sufficient to increase the solid angle at which light emitted by the junction will radiate externally from said side walls, but less than the thickness at which internal absorption in said third layer would substantially reduce the light emitted from said top surface of the diode.

11. A light emitting diode according to claim 10 wherein said first epitaxial layer further comprises a compensated layer adjacent said compensated second epitaxial layer, and a predominantly uncompensated layer adjacent said substrate.

12. A light emitting diode according to claim 11 wherein said substrate and said first epitaxial layers are n-type conductivity and said second and third layers are p-type conductivity.

13. A light emitting diode according to claim 11 wherein said substrate and said first epitaxial layers are p-type conductivity and said second and third layers are n-type conductivity.

14. A light emitting diode according to claim 10 wherein said third layer is predominantly uncompensated.

15. A light emitting diode according to claim 10 wherein said substrate is predominantly uncompensated.

16. A light emitting diode according to claim 10 wherein said third epitaxial layer has a thickness of about 25 microns.

17. A light emitting diode according to claim 10 wherein said top surface has an area of at least about 200 by 200 square microns.

18. A light emitting diode according to claim 10 wherein said epitaxial layers form a mesa structure upon said substrate.

19. A light emitting diode according to claim 10 wherein one of said ohmic contacts comprises an unannealed metal contact adjacent said third layer, said metal contact forming a reflective surface from which light generated by said diode will reflect rather than be absorbed.

20. A light emitting diode according to claim 19 and further comprising a highly doped layer between said third layer and said unannealed metal contact, said highly doped layer having the same conductivity type as said third layer, and said highly doped layer having a dopant concentration sufficient to lower the barrier between said metal contact and said third epitaxial layer sufficiently to provide ohmic behavior between said unannealed metal and said third epitaxial layer, said highly doped layer being thin enough to prevent the dopant concentration from substantially reducing the light emitted from said top surface of said third epitaxial layer.

21. A light emitting diode according to claim 10 wherein one of said ohmic contacts comprises an unannealed metal contact adjacent said substrate, said metal contact forming a reflective surface from which light generated by said diode will reflect rather than be absorbed.

22. A light emitting diode according to claim 21 and further comprising a highly doped layer between said substrate and said unannealed metal contact, said highly doped layer having the same conductivity type as said substrate, and said highly doped layer having a dopant concentration sufficient to lower the barrier between said metal contact and said substrate sufficiently to provide ohmic behavior between said unannealed metal and said substrate, said highly doped layer being thin enough to prevent the dopant concentration from substantially reducing the light emitted from said substrate.

23. A light emitting diode according to claim 21 wherein said metal contact is selected from the group consisting of aluminum, gold, platinum, and silver.

24. A light emitting diode according to claim 10 wherein the silicon carbide has a polytype selected from the group consisting of the 6H, 4H, and 15R polytypes.

25. A light emitting diode according to claim 10 wherein at least one of said ohmic contacts comprises a layer of indium-tin-oxide (ITO) on said third epitaxial layer, said ITO layer having a thickness sufficient to carry current to said third layer sufficient for said diode to emit light, but thin enough to remain substantially transparent.

26. A light emitting diode according to claim 10 wherein one of said ohmic contacts is to said substrate and the other is to said third epitaxial layer.

27. A light emitting diode that emits light in the blue portion of the visible spectrum with high external quantum efficiency, said diode comprising:
a single crystal silicon carbide substrate having a first conductivity type;
a first epitaxial layer of silicon carbide on said substrate and having the same conductivity type as said substrate;
a second epitaxial layer of silicon carbide on said first epitaxial layer and having the opposite conductivity type from said first layer,
said first and second epitaxial layers forming a p-n junction; and
ohmic contacts for applying a potential difference across said p-n junction; and wherein
said second layer has side walls and a top surface that forms the top surface of said diode, and said second epitaxial layer has a thickness of about 25 microns and said top surface has an area of about 200 by 200 square microns.

28. A light emitting diode according to claim 27 wherein at least one of said ohmic contacts comprises an unannealed metal contact adjacent said second layer, said metal contact forming a reflective surface from which light generated by said diode will reflect rather than be absorbed.

29. A light emitting diode according to claim 28 and further comprising a highly doped layer between said second layer and said unannealed metal contact, said highly doped layer having the same conductivity type as said second layer, and said highly doped layer having a dopant concentration sufficient to lower the barrier between said metal contact and said second epitaxial layer sufficiently to provide ohmic behavior between said unannealed metal and said second epitaxial layer, said highly doped layer being thin enough to prevent the dopant concentration from substantially reducing the light emitted from said top surface of said second epitaxial layer.

30. A light emitting diode according to claim 28 wherein said metal contact is selected from the group consisting of aluminum, gold, platinum, and silver.

31. A light emitting diode according to claim 27 wherein the silicon carbide has a polytype selected from the group consisting of the 6H, 4H, and 15R polytypes.

32. A light emitting diode according to claim 27 wherein at least one of said ohmic contacts comprises a layer of indium-tin-oxide (ITO) on said second epitaxial layer, said ITO layer having a thickness sufficient to carry current to said second layer sufficient for said diode to emit light, but thin enough to remain substantially transparent.

33. A light emitting diode according to claim 27 wherein one of said ohmic contacts is to said substrate and the other is to said second epitaxial layer.

34. A light emitting diode according to claim 27 wherein said second epitaxial layer is formed of a compensated layer adjacent said junction and a substantially uncompensated layer on said compensated layer.

35. A light emitting diode that emits light in the blue portion of the visible spectrum with high external quantum efficiency, said diode comprising:
a single crystal silicon carbide substrate having a first conductivity type;
a first epitaxial layer of silicon carbide on said substrate and having the same conductivity type as said substrate;
a second epitaxial layer of silicon carbide on said first epitaxial layer and having the opposite conductivity type from said first layer,
said first and second epitaxial layers forming a p-n junction; and
a highly reflective metal ohmic contact adjacent said second layer, said metal contact forming a highly reflective surface from which light generated by said diode will reflect rather than be absorbed.

36. A light emitting diode according to claim 35 and further comprising a highly doped layer between said second layer and said unannealed metal contact, said highly doped layer having the same conductivity type as said second layer, and said highly doped layer having a dopant concentration sufficient to lower the barrier between said metal contact and said second epitaxial layer sufficiently to provide ohmic behavior between said unannealed metal and said second epitaxial layer, said highly doped layer being thin enough to prevent the dopant concentration from substantially reducing the light emitted from said top surface of said second epitaxial layer.

37. A light emitting diode according to claim 36 wherein the dopant concentration of said highly doped layer is greater than about 2E19.

38. A light emitting diode according to claim 36 wherein the dopant concentration of said highly doped layer is greater than about 5E19.

39. A light emitting diode according to claim 35 wherein said second epitaxial layer has side walls and a top surface that forms the top surface of said diode, and said second epitaxial layer has a thickness sufficient to increase the solid angle at which light emitted by the junction will radiate externally from said side walls, but less than the thickness at which internal absorption in said second layer would substantially reduce the light emitted from said top surface of the diode.

40. A light emitting diode according to claim 35 wherein said second layer has side walls and a top surface that forms the top surface of said diode, and said second epitaxial layer has a thickness of about 25 microns and said top surface has an area of about 200 by 200 square microns.

41. A light emitting diode according to claim 35 further comprising a layer of indium-tin-oxide (ITO) on said substrate, said ITO layer having a thickness sufficient to carry current to said substrate sufficient for said diode to emit light, but thin enough to remain substantially transparent.

42. A light emitting diode according to claim 35 wherein said metal contact is selected from the group consisting of aluminum, gold, platinum, and silver.

43. A light emitting diode according to claim 35 wherein the silicon carbide has a polytype selected from the group consisting of the 6H, 4H, and 15R polytypes.

44. A light emitting diode that emits light in the blue portion of the visible spectrum with high external quantum efficiency, said diode comprising:
a single crystal silicon carbide substrate having a first conductivity type;
a first epitaxial layer of silicon carbide on said substrate and having the same conductivity type as said substrate;

a second epitaxial layer of silicon carbide on said first epitaxial layer and having the opposite conductivity type from said first layer, said first and second epitaxial layers forming a p-n junction; and a transparent conductive contact on said second layer.

45. A light emitting diode according to claim 44 wherein said transparent conductive contact comprises indium-tin-oxide (ITO).

46. A light emitting diode according to claim 45 wherein said indium-tin-oxide covers substantially the entire surface of said second layer.

47. A light emitting diode according to claim 44 wherein said second epitaxial layer has side walls and a top surface that forms the top surface of said diode, and said second epitaxial layer has a thickness sufficient to increase the solid angle at which light emitted by the junction will radiate externally from said side walls, but less than the thickness at which internal absorption in said second layer would substantially reduce the light emitted from said top surface of the diode.

48. A light emitting diode according to claim 47 wherein said top surface has an area of at least about 200 by 200 square microns.

49. A light emitting diode according to claim 44 and further comprising an unannealed metal ohmic contact to said substrate, said metal contact forming a reflective surface from which light generated by said diode will reflect rather than be absorbed.

50. A light emitting diode according to claim 49 and further comprising a highly doped layer between said unannealed metal contact and said substrate, said highly doped layer having the same conductivity type as said substrate, and said highly doped layer having a dopant concentration sufficient to lower the barrier between said metal contact and said substrate to provide ohmic behavior between said unannealed metal and said diode portion, and wherein the thickness of the highly doped layer is less than the thickness at which said highly doped layer would substantially reduce the light emitted from said substrate.

51. A light emitting diode according to claim 49 wherein said metal contact is selected from the group consisting of aluminum, gold, platinum, and silver.

52. A light emitting diode according to claim 44 wherein the silicon carbide has a polytype selected from the group consisting of the 6H, 4H, and 15R polytypes.

53. A light emitting diode that emits light in the blue portion of the visible spectrum with high external quantum efficiency, said diode comprising:

a single crystal silicon carbide substrate having a first conductivity type;

a first epitaxial layer of silicon carbide on said substrate and having the same conductivity type as said substrate;

a second epitaxial layer of silicon carbide on said first epitaxial layer and having the opposite conductivity type from said first layer, said first and second epitaxial layers forming a p-n junction;

an unannealed metal ohmic contact adjacent said second layer, said metal contact forming a reflective surface from which light generated by said diode will reflect rather than be absorbed; and a highly doped layer between said second layer and said unannealed metal contact, said highly doped layer having the same conductivity type as said second layer, and said highly doped layer having a dopant concentration sufficient to lower the barrier between said metal contact and said second epitaxial layer sufficiently to provide ohmic behavior between said unannealed metal and said second epitaxial layer, said highly doped layer being thin enough to prevent the dopant concentration from substantially reducing the light emitted from said top surface of said second epitaxial layer.

* * * * *

UNITED STATES PATENT AND TRADEMARK OFFICE
CERTIFICATE OF CORRECTION

PATENT NO. :   5,416,342

DATED      :   May 16, 1995

INVENTOR(S) :  Edmond et al.

It is certified that error appears in the above-identified patent and that said Letters Patent is hereby corrected as shown below:

On the title page:
[56] OTHER PUBLICATIONS

Column 2, line 2, "vol." should be "Vol.".

Column 1, line 39, "(SIC)" should be --(SiC)--.

Column 1, line 62, "(GAP)" should be --(GaP)--.

Column 3, line 18, "110" should be --10--.

Column 5, line 51, before "U.S." insert --copending--.

Column 6, line 3, after "layer" (second occurrence), insert --23--.

Column 6, line 16, after "layer" insert --24--.

Column 6, line 19, after "and" insert --22--.

Column 6, line 28, after "sidewalls" insert --26--.

UNITED STATES PATENT AND TRADEMARK OFFICE
CERTIFICATE OF CORRECTION

PATENT NO. :   5,416,342
DATED      :   May 16, 1995
INVENTOR(S):   Edmond et al.

It is certified that error appears in the above-identified patent and that said Letters Patent is hereby corrected as shown below:

Column 6, line 34, after "and" insert --23--.

Column 7, line 38, "170" should be --170--.

Column 7, line 39, "170" should be --170--.

Signed and Sealed this

Fourth Day of June, 1996

*Attest:*

BRUCE LEHMAN

*Attesting Officer*    *Commissioner of Patents and Trademarks*